(12) United States Patent
Van De Ven et al.

(10) Patent No.: US 9,897,276 B2
(45) Date of Patent: Feb. 20, 2018

(54) REDUCED PHOSPHOR LIGHTING DEVICES

(75) Inventors: Antony P. Van De Ven, Hong Kong (CN); Christopher Hussell, Cary, NC (US); Ronan P. Letoquin, Fremont, CA (US); Zongjie Yuan, Ventura, CA (US); Tao Tong, Oxnard, CA (US); Peter Guschl, Carpinteria, CA (US)

(73) Assignee: Cree, Inc., Durham, NC (US)

( * ) Notice: Subject to any disclaimer, the term of this patent is extended or adjusted under 35 U.S.C. 154(b) by 1010 days.

(21) Appl. No.: 13/218,980

(22) Filed: Aug. 26, 2011

(65) Prior Publication Data

US 2013/0050979 A1 Feb. 28, 2013

(51) Int. Cl.
*F21V 3/04* (2006.01)
*F21K 9/232* (2016.01)
*F21K 9/64* (2016.01)
*H01L 25/075* (2006.01)
*F21V 29/77* (2015.01)
*F21Y 115/10* (2016.01)

(52) U.S. Cl.
CPC ............... *F21V 3/04* (2013.01); *F21K 9/232* (2016.08); *F21K 9/64* (2016.08); *F21V 3/0427* (2013.01); *F21V 3/0445* (2013.01); *F21V 3/0463* (2013.01); *F21V 3/0481* (2013.01); *F21V 29/773* (2015.01); *F21Y 2115/10* (2016.08); *H01L 25/0753* (2013.01); *H01L 2924/0002* (2013.01)

(58) Field of Classification Search
CPC .......... F21K 9/56; F21K 9/135; F21V 3/0427; F21V 3/0445; F21V 3/04
USPC .......................................................... 362/84
See application file for complete search history.

(56) References Cited

U.S. PATENT DOCUMENTS

| 8,057,706 | B1 * | 11/2011 | Setlur et al. ........... 252/301.4 H |
| 2002/0043926 | A1 | 4/2002 | Takahashi et al. |
| 2004/0116033 | A1 * | 6/2004 | Ouderkirk ............. H01L 33/505 445/23 |
| 2004/0207998 | A1 | 10/2004 | Suchiro et al. |
| 2005/0239227 | A1 | 10/2005 | Aanegola et al. |
| 2006/0119250 | A1 * | 6/2006 | Suehiro ................ B60Q 1/2696 313/498 |
| 2006/0158089 | A1 | 7/2006 | Saito et al. |
| 2007/0120135 | A1 | 5/2007 | Soules et al. |

(Continued)

FOREIGN PATENT DOCUMENTS

| JP | 2003110146 | 4/2003 |
| WO | 2004021461 A2 | 3/2004 |
| WO | 2010128419 A1 | 11/2010 |

OTHER PUBLICATIONS

Hussell, Christopher P., et al., U.S. Appl. No. 13/029,063, filed Feb. 16, 2011.

(Continued)

*Primary Examiner* — Anne Hines
(74) *Attorney, Agent, or Firm* — Christopher J. Knors; Moore & Van Allen PLLC

(57) ABSTRACT

A lighting device comprising a solid-state light source, and a diffuser configured for color mixing of the light from the solid-state light source and spatially separated therefrom, the diffuser comprising at least one phosphor material. Methods of fabricating a lighting device having a reduced total amount of phosphor comprising combining an amount of phosphor with a diffuser structure.

33 Claims, 8 Drawing Sheets

(56) References Cited

U.S. PATENT DOCUMENTS

| | | |
|---|---|---|
| 2008/0029720 A1* | 2/2008 | Li .................... C09K 11/0883 250/581 |
| 2008/0173884 A1 | 7/2008 | Chitnis et al. |
| 2009/0184333 A1 | 7/2009 | Wang et al. |
| 2009/0296384 A1* | 12/2009 | Van De Ven et al. ........ 362/231 |
| 2011/0006668 A1 | 1/2011 | Hussell et al. |
| 2012/0086034 A1* | 4/2012 | Yuan ........................ F21K 9/56 257/98 |
| 2012/0155059 A1 | 6/2012 | Hoelen et al. |

OTHER PUBLICATIONS

European Patent Office, PCT International Search Report and WrittenOpinion for International Application No. PCT/US2012/050900 date of completion Oct. 10, 2012.

European Patent Office; European Office Action for Application No. 12 759 299.6 dated Mar. 26, 2015.

Chinese Patent Office; Chinese Office Action for Application No. 201280052766.3 dated May 26, 2015.

Cree, Inc., European Application No. 12759299.6, Office Action, dated Jan. 29, 2016.

\* cited by examiner

REDUCED PHOSPHOR LIGHTING DEVICES

TECHNICAL FIELD

The present disclosure relates generally to lighting devices having reduced phosphor content with improved color uniformity and methods of manufacturing same. Specifically, the present disclosure relates to a remote phosphor solid-state lighting devices with a diffuser comprising the phosphor.

BACKGROUND

Light emitting diodes (LED or LEDs) are solid-state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Light emitting diode (LED) lighting systems are becoming more prevalent as replacements for existing lighting systems. LEDs are an example of solid state lighting (SSL) and have advantages over traditional lighting solutions such as incandescent and fluorescent lighting because they use less energy, are more durable, operate longer, can be combined in red-blue-green arrays that can be controlled to deliver virtually any color light, and contain no lead or mercury. In many applications, one or more LED dies (or chips) are mounted within an LED package or on an LED module, which may make up part of a lighting unit, lamp, "light bulb" or more simply a "bulb," which includes one or more power supplies to power the LEDs. An LED bulb may be made with a form factor that allows it to replace a standard threaded incandescent bulb, or any of various types of fluorescent lamps. LEDs can also be used in place of florescent lights as backlights for displays.

Color reproduction can be an important characteristic of any type of artificial lighting, including LED lighting. For lamps, color reproduction is typically measured using the color rendering index (CRI). The CRI is a relative measurement of how the color rendition of an illumination system compares to that of a particular known source of light. In more practical terms, the CRI is a relative measure of the shift in surface color of an object when lit by a particular lamp. The CRI equals 100 if the color coordinates of a set of test surfaces being illuminated by the lamp are the same as the coordinates of the same test surfaces being irradiated by the known source. CRI is a standard for a given type light or light from a specified type of source with a given color temperature. A higher CRI is desirable for any type of replacement lamp.

To achieve accurate color, wavelength conversion material is sometimes used in lighting systems. The wavelength conversion materials may produce white light when struck by light of a specified color, or may produce an additional color of light that mixes with other colors of light to produce white light, or another specific desired color of light. For example, an LED can be coated or covered with a phosphor layer having a phosphor material that absorbs radiation energy in one portion of the electromagnetic spectrum and emits energy in another portion of the electromagnetic spectrum. The color of the emission from the phosphor can be controlled by the selection of excitation source and phosphor. Various combinations of excitation sources and/or phosphor emissions are possible to provide light of a specific color, including white light.

SUMMARY

In some embodiments, the present disclosure provides for a luminaire comprising a excitation source, e.g., a solid state light source, and a diffuser structure disposed to diffuse light from the excitation source to provide uniform spatial correlated color temperature (CCT) and/or angular color homogeneity of the resultant illumination. A predetermined volume of phosphor is provided in the diffuser, or a thin or dilute layer of phosphor is applied to the diffuser to provide wavelength conversion for at least a portion of the light from the excitation source. In one aspect, the luminaire is configured to emit substantially white light.

Thus, in a first embodiment, a lighting device is provided. The device comprises a solid-state light source, a diffuser structure configured for color mixing of the light from the solid-state light source and spatially separated therefrom; the diffuser comprising a phosphor material.

In a second embodiment, a lighting device is provided, the lighting device comprising a LED light source; a diffuser configured for color mixing of the light from the LED light source and spatially separated therefrom; the diffuser comprising a phosphor in combination with a reflective material.

In a third embodiment, a method of fabricating a lighting device having a reduced total amount of phosphor is provided. The method comprises the steps of providing a LED light source and providing a diffuser structure with an amount of phosphor, the diffuser structure configured for color mixing of the light from a LED light source and for spatially separating the amount of phosphor from the LED light source. The amount of phosphor used is reduced at least 5 percent by weight compared to a similar lighting device having: (i) the phosphor deposited on the LED light source and (ii) having substantially similar spatially correlated color temperature (CCT) variance or angular color homogeneity.

DETAILED DESCRIPTION

Figure 1:
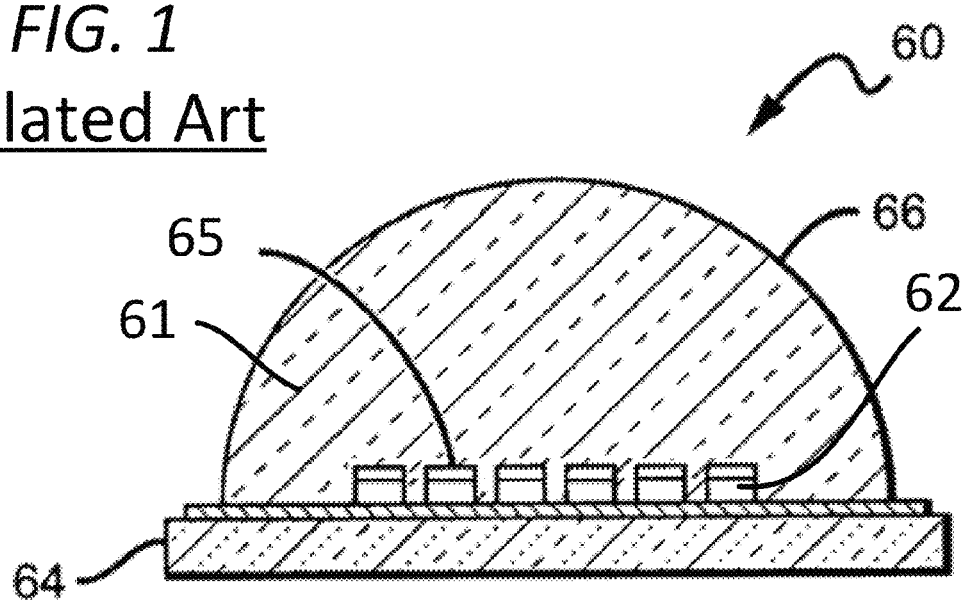
FIG. 1 is a sectional view of a conventional solid-state lighting device.

As examples of embodiments and aspects of the present disclosure, lighting devices are provided comprising a solid state lighting device, e.g., LED devices, comprising reduced phosphor content spatially separated from the LED devices, the phosphor being associated with a diffuser. Specifically, the present disclosure relates to lighting devices having a phosphor spatially separated from the solid-state lighting devices in combination with a diffuser, either contained within or on the diffuser.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The term "emission," as used herein when referring to a light source, means that at least some current is being supplied to the light source to cause the light source to emit at least some light. The expression "excitation peak emission" encompasses situations where the light source, e.g., a light emitting diode (LED) emits a relatively discrete band of light (e.g., a subset of the electromagnetic spectrum, such as UV, blue, red, etc.) continuously or intermittently at a rate such that a human eye would perceive it as emitting light continuously, or where a plurality of light sources producing the same color or different colors are emitting light intermittently and/or alternatingly (with or without overlap in "on" times) in such a way that a human eye would perceive them as emitting light continuously (and, in cases where different colors are emitted, as a mixture of those colors).

The term "illumination" (or "illuminated"), as used herein when referring to a light source, means that at least some current is being supplied to the light source to cause the light source to emit at least some light. The expression "illuminated" encompasses situations where the light source is a solid state light emitter or other luminary that emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The terms "phosphor" and "phosphors" is used herein to refer to any material or composition of matter that absorb light at one wavelength and re-emits light at a different wavelength, regardless of the delay between absorption and re-emission, and regardless of the wavelengths involved. Accordingly, "phosphors" encompasses "lumiphors," "wavelength converting materials," "luminescent materials," and "color shifting elements," and is used herein to encompass such materials that are fluorescent and/or phosphorescent and/or can be particles which absorb light having an absorbing wavelength(s) and re-emit light having longer or shorter wavelength(s). Inclusion of phosphor materials in LED devices can been accomplished in a variety of ways, one representative way being by adding the phosphor materials to a clear or transparent encapsulant material (e.g., epoxy-based, silicone-based, glass-based or metal oxide-based material) as discussed herein, for example by a blending or coating process.

The phrases "phosphor layer" and "phosphor coating" are used herein interchangeably to refer to any layer(s) or similar structure comprising or consisting of one or more phosphors. In one aspect, there can be provided a plurality of "phosphor layers," for example, each of the plurality represented individually by a laminate structure. A layer can be co-planar with another layer on a substrate, for example, two phosphor layers of different composition but similar (or different) thickness can be spatially arranged on a substrate as layers.

As used herein, the expression "radiationally coupled" refers to a phosphor material being excited by a light source when the light source is emitting light. For example, a red phosphor that is "radiationally coupled" to a UV light source would be excited upon receiving light emission from the UV light source.

The phrase "spatially separated" as used herein, with reference to a phosphor material, encompasses complete or partial physical separation of a volume of the material, as well as gradients of the material in one or more dimensions (length, width, height) from the light source. Thus, the phrase "spatial separated" includes phosphors, phosphor layers and diffusers being remote to the light source. Remote in this context refers to being spaced apart from and/or to not being on or in direct thermal contact.

The phrase "correlated color temperature" is used according to its well-known meaning to refer to the temperature of a blackbody that is, in a well-defined sense (i.e., can be readily and precisely determined by those skilled in the art), nearest in color.

The phrase "luminous efficacy" is used herein as it is conventionally used, e.g., the ratio of luminous flux to power. Depending on context, the power can be either the radiant flux of the source's output, or it can be the total electric power consumed by the source. Luminous efficacy is typically expressed in units of lumens per watt (lm/W), for example, the maximum human photopic luminous efficacy is 683 lm/W for radiation 555 nm monochromatic light (green).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

A solid-state luminaire or lighting device is provided that ultimately will illuminate and activate a predetermined volume of phosphor within a diffuser, or a thin or dilute remote phosphor coating applied to a diffuser of the lighting device. The combination of diffuser and remote phosphor provides for a reduction in the total amount of phosphor used per device. Using a reduced volume or a thinner layer of remote phosphor reduces the amount of phosphor used per device, which in turn reduces total production cost for the device.

The diffuser can be constructed of any suitable material such as silicones, polyesters, polycarbonates, polyarylates, cyclic olefin copolymers (COC), and glass, as well as mixtures thereof. The diffuser structure can be pre-formed with the phosphor coated on a surface thereof such that the phosphor is spatially separated from the solid-state device. Suitable materials include organic polymers. Suitable transparent organic polymers include silicones, polyesters, polyurethanes, polyacrylics (e.g., polyacrylates, polymethacrylates, hereafter "poly(meth)acrylates"), polyarylates, cyclic olefinic copolymers, epoxies, fluoropolymers, and combinations thereof. The diffuser can be transparent or translucent in the visible region of the light spectrum. Examples of suitable materials include polydimethylsiloxane, polyurethanes, polyacrylates, polyarylates, cyclic olefinic copolymers (COC's), glass, ceramics, and their precursors, derivatives, mixtures, etc. can comprise such phosphors.

The diffuser structure can be fabricated with a curable and/or molten material having the phosphor distributively or dispersively combined therewith prior to curing/cooling the material in the shape and/or form for configuring with solid-state device or package. Polycarbonates include Lexan®, Makrolon® (e.g. Makrolon LED 2245), and Makroclear®. Polyarylates are a type of aromatic polyester. Representative polyarylates include, for example, ARDEL® from Plastics International (Eden Prairie, Minn.), poly-4-hydroxybenzoate (also called poly-p-hydroxybenzoate) and polybisphenol-A terephthalate. Cyclic olefin copolymers (COC) include for example APEL®, e.g. APL5514ML from Mitsui Chemical (Tokyo, Japan), TOPAS®, e.g., TOPAS 5013 from Topas Advanced Polymers, Inc., (Florance, Ky.). The diffuser can be etched or sand blasted on one or both of its inner/outer surfaces.

The diffuser can be fabricated from or comprise, for example, an optical material that forms or is configured to form a globe or other semi-spherical shape at least partially surrounding the LED device. The diffuser can also be configured to completely surround the LED device.

Different diffusers according to the present disclosure can comprise varying scattering properties along any direction of the interior and exterior surfaces. In some embodiments, the diffuser can comprise a transparent material (substrate) comprising a reflective material and a phosphor on its inside surface having varying scattering properties. Other configurations can comprise a transparent globe having reflective material and phosphor on its interior and/or exterior surface and/or embedded within the diffuser. One or more films of reflective material and phosphor can be used, having the same or different thicknesses, depending at least partially on the film/binder material used, type of reflective material, and/or phosphor, and the density, reflectivity, and/or index of refraction of reflective material in the film.

In embodiments where the phosphor is combined with or in the diffuser, the total weight percent of phosphor needed in the device is reduced while obtaining a predetermined spatially correlated color temperature (CCT) variance or angular color homogeneity comparable to a substantially similar conventional solid state lighting device with the phosphor being directly coated on the solid state light sources. Typically, about 65 weight percent phosphor in binder is used in a conventional LED luminare. Distributing or dispersing the phosphor in the diffuser effectively reduces the total amount of the phosphor used. For example, essentially all of the phosphor distributed into the diffuser is employed in the LED package, in contrast to conventional luminares that have the solid-state light sources directly coated with phosphor. In such conventional devices, the direct coating of the light sources inevitably results in some loss or waste of phosphor during manufacture, for example, by having the phosphor coating occur between the light sources or other locations.

In one aspect, the amount of phosphor in the diffuser is about 30 weight percent of the binder. In another aspect, as compared to a LED lighting device having the phosphor directly coated on the LEDs, the amount of phosphor of the devices prepared by the present disclosure can be reduced by about 5 percent, 10 percent, 15 percent, 20 percent, 25 percent, 30 percent, 35 percent, 40 percent, 45 percent, 50 percent, 55 percent, 60 percent or more, depending on the nature of the phosphor. For example, a typical phosphor loading of about 65 weight percent in binder can be reduced to about 30 weight percent or less. One or more phosphor materials may be present.

In yet another aspect, a reflective material can be used in combination with a phosphor material, which can also reduce the amount of phosphor required to attain a predetermined spatially correlated color temperature (CCT) variance or angular color homogeneity compared to a substantially similar conventional solid state lighting device with the phosphor being directly coated on the solid state light sources. In this aspect, a typical phosphor loading of about 65 weight percent in binder can be reduced to about 30 weight percent or less, with a portion (5-60 weight percent) of the phosphor being replaced with a reflective material. Thus, the reflective material can be present in an amount of about 5 weight percent of phosphor to about 60 weight percent of phosphor. This provides, for example, a diffuser comprising phosphor present in about 25 weight percent to about 60 weight percent, and reflective material present in an amount of about 5 weight percent of phosphor to about 60 weight percent of phosphor. In contrast, a conventional LED-phosphor coating processes (e.g., sputtering, CVD, spin coating, etc.) inevitably results in higher amounts of phosphor employed per device, as well as an amount of phosphor that is used in manufacturing the device but is nonetheless absent in the final LED package (loss), hence resulting in higher cost-per-package. Thus, the present disclosure provides for a fabrication method that is advantageous for producing lighting devices using the more expensive phosphors, such as red phosphors, which allows for more cost-effective manufacturing while maintaining acceptable spatially correlated color temperature (CCT) variance and/or angular color homogeneity in the package.

In embodiments where the phosphor is coated on the diffuser, the phosphor coating can have thicknesses (individual layer or total of multiple layers) in the range of 10-100 microns, while in other embodiments it can have thicknesses in the range of 40-50 microns. In certain aspects, the methods presently disclosed provide for controlled thickness of the phosphor(s) where the phosphor is deposited on one or both of the inner and outer surface of the diffuser around a predetermined thickness, e.g., 30-40 um, with a control of thickness variation (pre- or post-deposition) of +/−10 percent, 5 percent, or 1 percent. A typical distance between the LED element and the furthest remote point on the diffuser comprising phosphor (within or coated thereon) can be between 0.1 mm and 80 mm, or longer. The outer and/or inner surface of the diffuser can be etched or sand blasted prior to the phosphor coating.

In some embodiments, a transparent globe can have a film of reflective material and phosphor with a thickness ranging from 0.1 to 1000 microns, with the film being on the interior and/or exterior of the globe so as to function as a diffuser. For example, a transparent globe can be configured using a cellulose-based binder, a film thicknesses ranging from 0.1 to 100 microns, with the film being on the interior and/or exterior of the globe. In still other embodiments, the diffuser can comprise a transparent globe of one or more films of reflective material and phosphor in a methyl silicone based binder, with the films being on the interior and/or the exterior of the globe. The films in these embodiments can range in thickness from 0.1 to 700 microns, and can comprise one or more reflective materials as particles of the same or different materials. The thicknesses of the films can be greater than those described above and can utilize different binder, phosphors, and particle materials.

In some embodiments, the phosphor can be provided in as a layer in a binder having different predetermined concentrations or loading of phosphor in the binder suitable for coating on the diffuser or for forming the diffuser (e.g., diffuser precursor material). Exemplary binder materials can be an organic polymer, such as ethyl cellulose, nitrocellulose or poly(ethylene oxide) or an inorganic polymeric system, such as, silicone, ethyl polysilicate. epoxies, glass, inorganic glass, ceramics, dielectrics, BCB, polyimides, polymers and hybrids thereof, with the preferred material being silicone because of its high transparency and reliability in high power LEDs. Suitable phenyl- and methyl-based silicones are commercially available from Dow® Chemical. In still other embodiments the binder can comprise an enamel. The binder can be cured using many different curing methods depending on different factors such as the type of binder used. Different curing methods include but are not limited to heat, ultraviolet (UV), infrared (IR) or air curing. Various methods can be used to apply one or more layers of the same or different phosphor materials. Different phosphor materials can be applied in different areas of or on the diffuser using known techniques, such as CVD, sputtering, and/or masking processes. Other embodiments can comprise uniform and/or non-uniform distribution of phosphors in a film material, such as with different phosphor layer thicknesses and/or different phosphor material concentrations spatially arranged in the film material disposed on the diffuser.

The phosphor materials can be applied on diffuser using different processes including but not limited to spin coating, sputtering, printing, powder coating, electrophoretic deposition (EPD), electrostatic deposition, among others. The phosphor materials can be applied along with a binder material, but it is understood that a binder is not required. In still other embodiments, phosphor materials in the form of one or more layers can be separately fabricated and then mounted and/or adhered to the LED substrate, formed optical media, and/or diffuser. Exemplary coating processes are disclosed in co-assigned U.S. application Ser. No. 13/034,501 filed on Feb. 24, 2011, which is incorporated herein by reference.

In one embodiment, a phosphor material-binder mixture can be sprayed or dispersed over a diffuser or optical media with the binder then being cured to form the phosphor layer. In any of the above processes, one or more reflective materials can be combined or added to the phosphor for including in the diffuser or for coating on the diffuser.

The diffuser can comprise, in addition to the phosphor, scattering and/or reflecting material and associated carrier such as a glass enclosure, and can serve to scatter or re-direct at least some of the light emitted by the light source and/or phosphor carrier to provide a desired beam profile. The properties of the diffuser, such as geometry, scattering properties of the scattering layer, surface roughness or smoothness, and spatial distribution of the scattering layer properties may be used to control various lamp properties such as color uniformity and light intensity distribution as a function of viewing angle. In the present disclosure, these properties in combination with the remote, spatially separated phosphors, provides for the manufacture of lamps with reduced amount of phosphors, e.g., red phosphors.

The reflective material can be separate from the diffuser-phosphor structure, for example, the reflective material can be distributed or dispersed in the optical media between the LED devices and the diffuser-phosphor. In a preferred aspect, the reflective material is separated from the diffuser-phosphor structure and is distributed or dispersed in the optical media between the LED devices and the diffuser comprising phosphor to minimize the spatial CCT variance by vitrue of the large scattering volume the optical media provides compared to that of diffuser thickness volume. In this aspect, the weight percent of reflective material separate from the diffuser and in the optical media can be between 0.001 to about 1, or about 0.01 to about 0.1. Further reduction of the specific phosphor in the diffuser can be possible with the reflective material in the optical media, where the amount of reflective material minimizes spatial CCT variance and luminous efficacy losses.

Examples of reflective materials include titanium dioxide, zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof. The reflective material can be co-deposited with the phosphor to provide the coating. In one aspect, at least one of titanium dioxide and alumina are used as reflective materials. The reflective material can be layered over and/or between the phosphor coatings on one or both of the inner/outer sides of the diffuser. Alternatively, the reflective material can be separated by the thickness of the diffuser, e.g., reflective material on inner surface, phosphor on outer surface, or visa-versa. The amount of reflective material used can be about 1 percent to about 60 percent by weight of phosphor, or about 2 percent to about 50 percent by weight of phosphor. More weight percent of reflective material to phosphor can be used depending on the nature of the phosphor and LED combination.

In one aspect, compared to a LED lighting device having a remote phosphor coating, the combination of reflective material and phosphor on or in the diffuser can effectively reduce the amount of phosphor used by about 5 percent, 10 percent, 15 percent, 20 percent, 25 percent, 30 percent, 35 percent, 40 percent, 45 percent, 50 percent or more, depending on the nature of the phosphor. In another aspect, a spatially separated phosphor LED lighting device having a diffuser comprising a reflective material present in about 1 percent to about 50 percent by weight of phosphor provides excellent color uniformity and essentially 90 percent or better efficiency with a reduction of about 5-60 percent of the weight of phosphor.

Different sized phosphor materials (and/or reflective materials), in the form of particles can be used, including but not limited to nanoparticles or particles with average particle size in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. Reflective materials with average particle size of about 0.25 micron to about 10 micron, about 0.3 micron to about 7 micron, or about 0.5 micron to about 5 micron can be employed.

Any solid-state lighting source can be used. For purposes of illustration of the embodiments of the present disclosure, LED solid-state devices are used as examples. In an exemplary embodiment, light source comprises AlGaN and AlGaInN ultraviolet LED chips radiationally coupled to YAG-based or TAG-based yellow phosphor and/or group III nitride-based blue LED chips, such as GaN-based blue LED chips, are used together with a radiationally coupled YAG-based or TAG-based yellow phosphor. In this case, the phosphor is excited by both UV and blue light emitted from the ultraviolet/blue LED chips and then yellow light together with stray blue light can be mixed together providing a predetermined CCT and/or CRI.

As another example, the light source comprises LEDs of group III-nitride-based blue LED chips and/or group-III nitride-based ultraviolet LED chips with a combination or mixture of red, green and orange phosphor. In this case, the multi-phosphor material is excited by both UV and blue light emitted from the ultraviolet/blue LED chips and then mixture of red, green, orange light together with stray blue light can be mixed together providing a predetermined CCT value. The CCT value of the lighting device can be varied by adjusting the current to the ultraviolet LEDs thereby altering the relative UV light intensity to the phosphors to provide a second, or additional CCT value. Other combinations of LEDs and phosphors can be used in practicing the present disclosure.

In one aspect, the present lighting device includes filters to reduce or eliminate IR- and UV-light emanating from the device to avoid or prevent damage to delicate exhibits and/or surfaces. Such filters can be provided on or in the dome or encapsulating material or can be configured external to the device. UV filters can include L37 and/or L39 filters or the materials comprising the L37 and/or L39 filters, whereas an L37 filter effectively removes stray ultraviolet light with a wavelength shorter than 370 nm, whereas an L39 filter eliminates stray light with a wavelength shorter than 390 nm, while both filters are transparent to visible light. IR filters can include materials and coatings that are transparent to visible wavelengths and block essentially all of the infra red region of the electromagnetic spectrum. Combinations of UV/IR filters can be used, as well as visible "band pass" filters. Phosphor materials can be included in or on the UV/IR filters.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 1 shows a conventional monolithic LED package 60 comprising plural LED chips 62 mounted on the surface of a submount 64 with optical media 61 having a globe-like shape 66 about the perimeter of submount 64. The LED chips 62 are shown coated with one or more phosphors 65. The optical media 61 can be air and/or a substance having an appropriate difference in the refraction index as compared to the optical media 61. Phosphors present on the chips 62 typically emit light in all directions from any or all points. The light leaving the globe 66 and observed by an observer can be essentially all of the light emitted by the phosphor or a portion of that light, depending on the position of the observer. Such an effect is generally undesirable.

Figure 2:
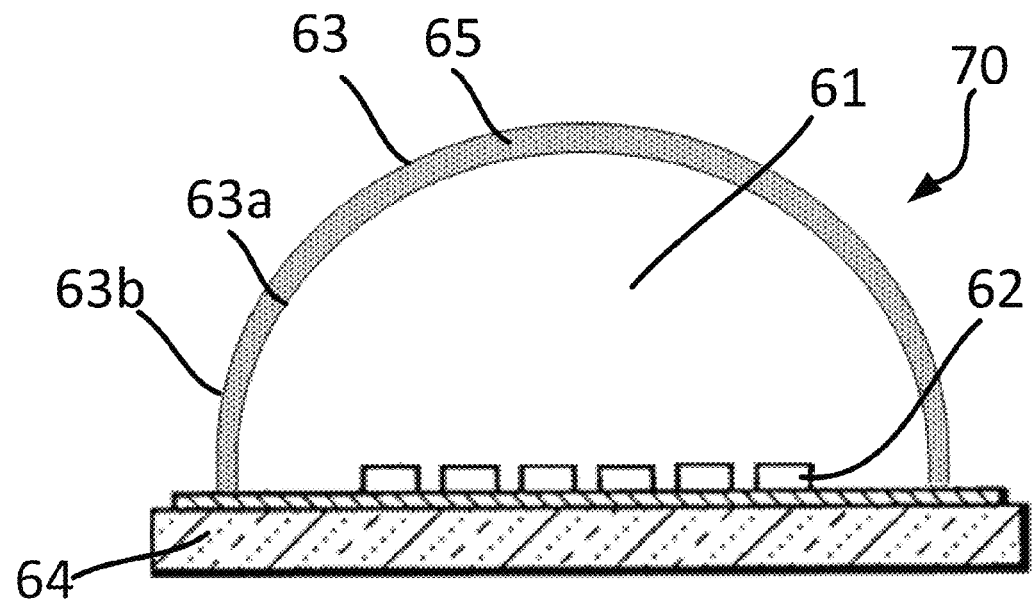
FIG. 2 is a sectional view representing an embodiment of the present disclosure.

FIG. 2 provides for an exemplary arrangement of spatially separated phosphor radiationally coupled to LEDs associated with a diffuser 63 in accordance with the present disclosure. Thus, monolithic LED package 70 is depicted comprising plural LED chips 62 mounted on the surface of a submount 64 with diffuser 63 having inner surface 63a and outer surface 63b comprising phosphor 65 about the perimeter of submount 64. In other embodiments, the LED chips can be mounted on a non-planar substrate or submount. At least some of LED chips 62 are interconnected in a series circuit. The LED chips 62 can be mounted on a substantially planar surface of submount 64 and arranged under a plurality of globed optical elements in addition to diffuser 63. Diffuser 63 has inner surface 63a in closer proximity to the LED chips 62 than outer surface 63b. Use of diffuser 63 with the spatially separated phosphor 65 in these configurations allows for uniformity in spatially correlated color temperature (CCT) variance and/or angular color homogeneity for the LED package 70. Diffuser 63 comprising the phosphor can further comprise reflective material as discussed below. Optical media 61 can be separate and apart from the diffuser 63 and/or can be formed separately or encapsulated by diffuser 63.

It is understood that LED components according to the present disclosure can be fabricated using a method that incorporates submount panel or wafer comprising a plurality of submounts. Each of submounts 64 can be formed with its own array of LEDs and globed optical elements such that multiple LED chips 62 can be formed across the submount panel. Multiple LED chips 62 can then be singulated from the submount panel. Each submount 64 may also comprise a more complex combination of elements such as a plurality of "submount" assemblies which are mounted on a planar surface of submount. The submount assemblies can have different functionalities such as providing electrostatic discharge (ESD) protection for the various LED chips. The size of submount 64 in LED package 70 can vary depending on certain factors such as the size and number of LEDs. It is understood that submount 64 can have essentially any shape, such as circular, oval, rectangular, hexagonal, or other multiple sided shapes. In another embodiment, single LED element luminary packages can also be provided. The LED device can be configured as a flip chip LED package.

It is understood that the LED chips in the arrays as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

Figure 3:
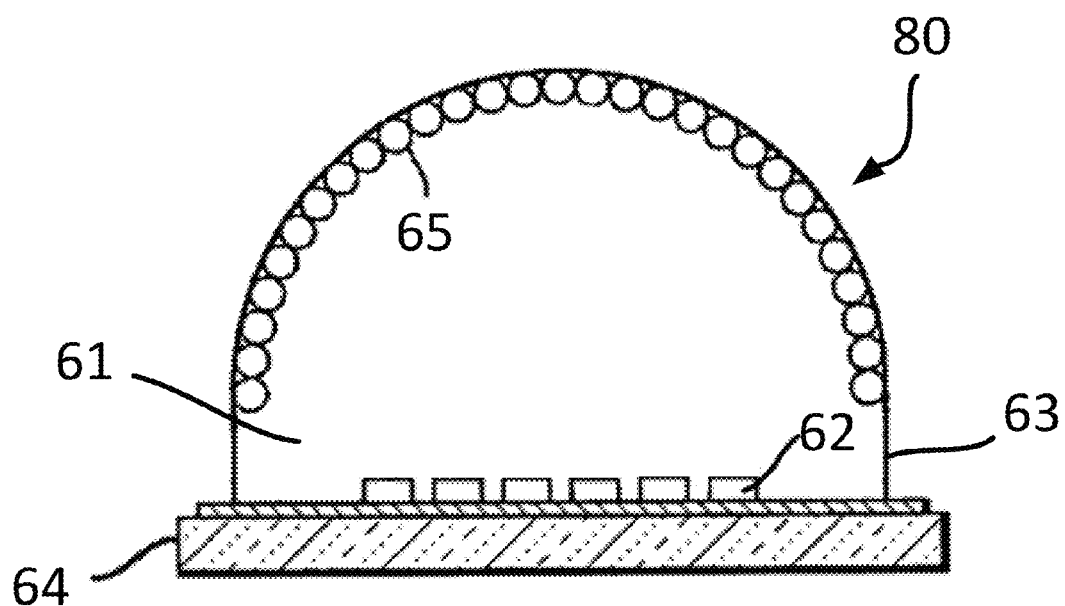
FIG. 3 is a sectional view representing an alternate embodiment of the present disclosure.

FIG. 3 provides for an alternative arrangement of phosphors-diffuser in accordance with various embodiments of the present disclosure. Thus, monolithic LED package 80 is depicted comprising plural LED chips 62 mounted on the surface of submount 64 with diffuser 63 about the perimeter of submount 64. Diffuser 63 is coated on inner surface with phosphor 65. Phosphor 65 can be combined with reflective material (not shown) or the reflective material can be present in the optical media 61, or coated on substrate 64.

Figure 4:
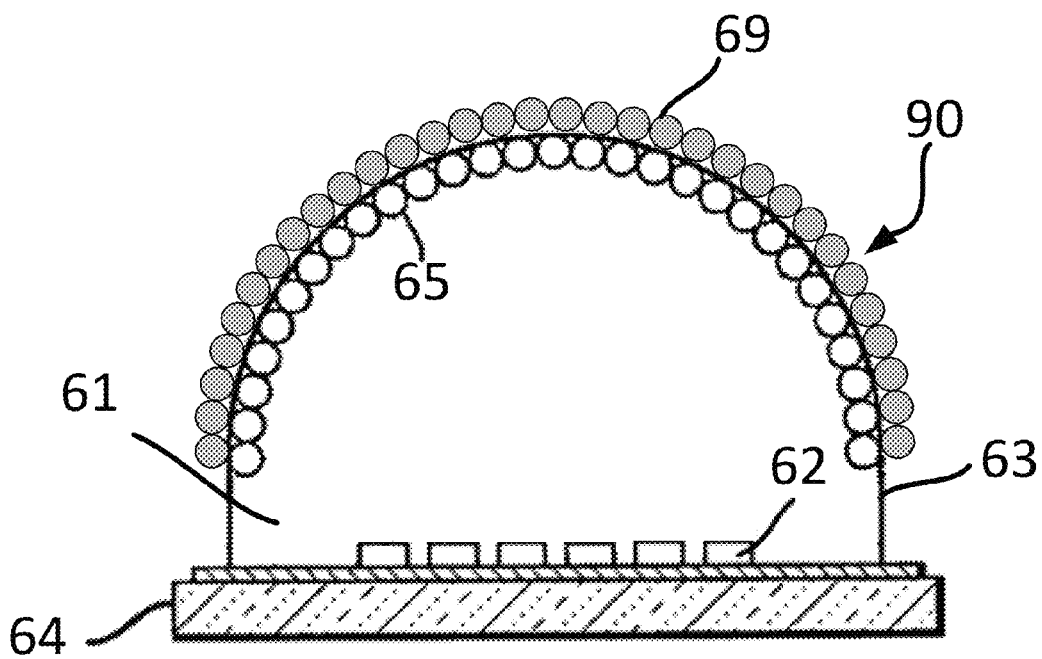
FIG. 4 is a sectional view representing an alternate embodiment of the present disclosure.
Figure 6:
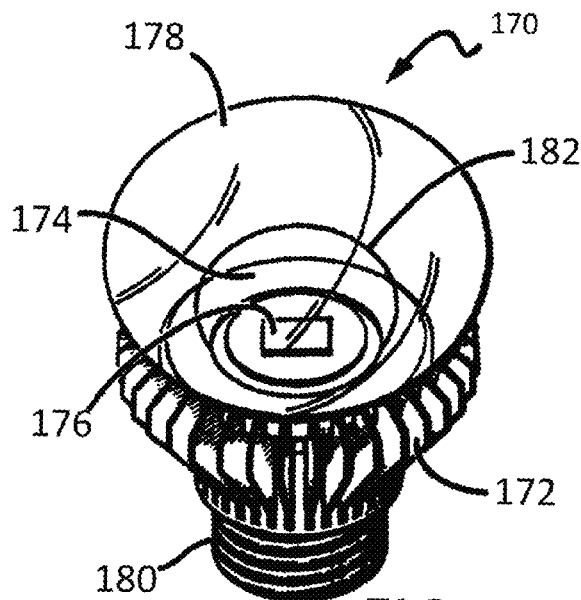
FIG. 6 is a perspective view of a lamp according to an embodiment of the present disclosure.

FIG. 4 provides for an alternative arrangement of phosphors-diffuser in accordance with various embodiments of the present disclosure. Thus, monolithic LED package 90 is depicted comprising plural LED chips 62 mounted on the surface of submount 64 with diffuser 63 about the perimeter of submount 64. Diffuser 63 is coated on inner surface with phosphor 65 and on outer surface with additional phosphor 69. Phosphors 65, 69 can be the same or different. One or more globes can be configured about the diffuser, for example, as shown in FIG. 6, to adjust the luminous intensity and/or CRI of the lighting device. In this aspect, additional phosphor can be coated on the outside side of the diffuser, i.e., at the side facing toward the additional globe, forming a layer or shell of phosphor over the diffuser.

Figure 5:
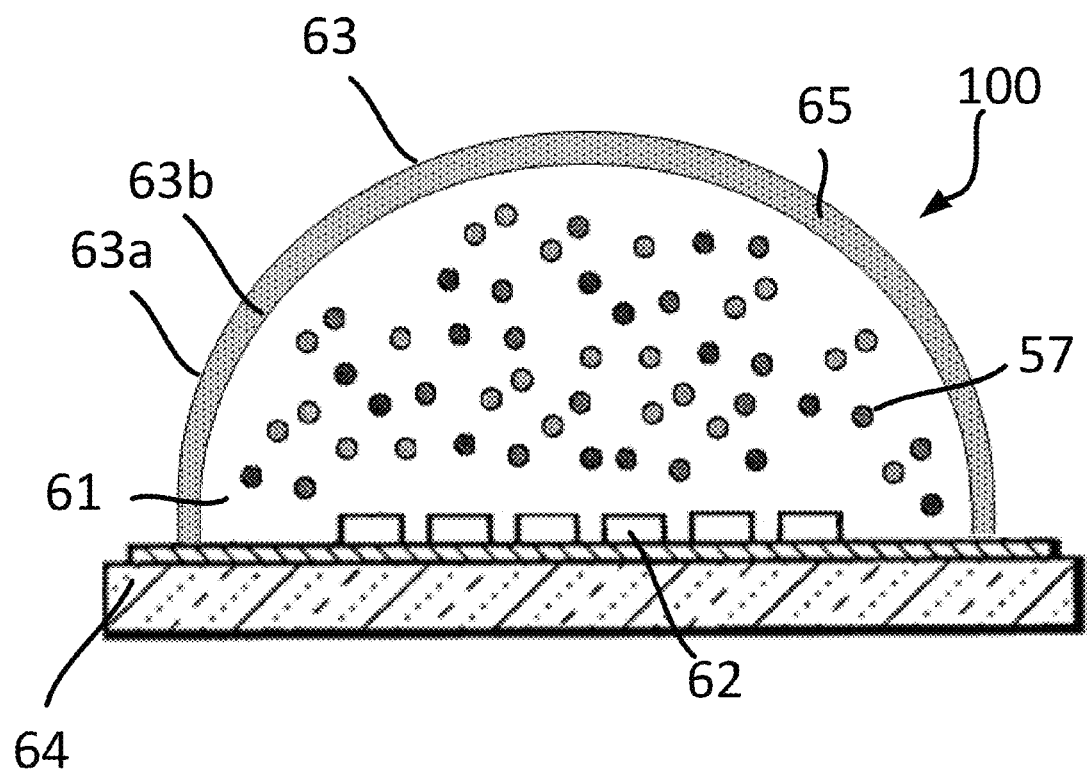
FIG. 5 is a sectional view representing an alternate embodiment of the present disclosure.

FIG. 5 provides for an alternative arrangement of phosphors-diffuser in accordance with various embodiments of the present disclosure. Thus, monolithic LED package 100 is depicted comprising plural LED chips 62 mounted on the surface of submount 64 with diffuser 67 having inner surface 63a and outer surface 63b comprising phosphor 65. Reflective material 57 in optical media 61 provides for increased luminous intensity.

In one exemplary embodiment according to the present disclosure, the LED chips 62 are configured to provide a resultant light, e.g., cool white or warm white (or other color). For example, LEDs chips 62 can have an LED that emits light in the blue wavelength spectrum and the phosphor absorbs some of the blue light and re-emits yellow, with the LED chips 62 emitting a white light combination of blue and yellow light. In one embodiment, the phosphor comprises commercially available YAG:Ce, although a full range of broad yellow spectral emission is possible using conversion particles made of phosphors based on the (Gd,Y)$_3$(Al,Ga)$_5$O$_{12}$:Ce system, such as the Y$_3$Al$_5$O$_{12}$:Ce (YAG). Other yellow phosphors that can be used for white emitting LED chips include, for example: Tb$_{3-x}$RE$_x$O$_{12}$:Ce (TAG); RE=Y, Gd, La, Lu; or Sr$_{2-x-y}$Ba$_x$Ca$_y$SiO$_4$:Eu.

Some phosphors appropriate for these structures can comprise, for example: Red Lu$_2$O$_3$:Eu$^{3+}$(Sr$_{2-x}$La$_x$)(Ce$_{1-x}$Eu$_x$)O$_4$Sr$_2$Ce$_{1-x}$Eu$_x$O$_4$Sr$_{2-x}$Eu$_x$CeO$_4$SrTiO$_3$:Pr$^{3+}$, Ga$^{3+}$ CaAlSiN$_3$:Eu$^{2+}$Sr$_2$Si$_5$N$_8$:Eu$^{2+}$ as well as SrxCal-xS:Eu, Y; Y=halide; CaSiAlN$_3$:Eu; and/or Sr2-yCaySiO$_4$:Eu. Other phosphors can be used to create color emission by converting substantially all light to a particular color. For example, the following phosphors can be used to generate green light: SrGa$_2$S$_4$:Eu; Sr$_{2-y}$Ba$_y$SiO$_4$:Eu; or SrSi$_2$O$_2$N$_2$:Eu. The following lists some additional suitable phosphors, for example as particles in one or more layers, although others can be used. One or more of these phosphors exhibits excitation by blue and/or UV LEDs, has efficient light conversion, and has acceptable Stokes shift:

| YELLOW/GREEN | RED |
|---|---|
| (Sr,Ca,Ba)(Al,Ga)$_2$S$_4$:Eu$^{2+}$ | Lu$_2$O$_3$:Eu$^{3+}$ |
| Ba$_2$(Mg,Zn)Si$_2$O$_7$:Eu$^{2+}$ | (Sr$_{2-x}$La$_x$)(Ce$_{1-x}$Eu$_x$)O$_4$ |
| Gd$_{0.46}$Sr$_{0.31}$Al$_{1.23}$O$_x$F$_{1.38}$:Eu$^{2+}$$_{0.06}$ | Sr$_2$Ce$_{1-x}$Eu$_x$O$_4$ |
| (Ba$_{1-x-y}$Sr$_x$Ca$_y$)SiO$_4$:Eu | Sr$_{2-x}$Eu$_x$CeO$_4$ |
| Ba$_2$SiO$_4$:Eu$^{2+}$ | SrTiO$_3$:Pr$^{3+}$,Ga$^{3+}$ |
| Lu$_3$Al$_5$O$_{12}$ doped with Ce$^{3+}$ | CaAlSiN$_3$:Eu$^{2+}$ |
| (Ca,Sr,Ba)Si$_2$O$_2$N$_2$ doped with Eu$^{2+}$ | Sr$_2$Si$_5$N$_8$:Eu$^{2+}$ |
| CaSc$_2$O$_4$:Ce$^{3+}$ | |
| (Sr,Ba)$_2$SiO$_4$:Eu$^{2+}$ | |

By way of example, each of the following phosphors exhibits excitation in the UV emission spectrum, provides a desirable peak emission, has efficient light conversion, and has acceptable Stokes shift, for example: Yellow/Green: (Sr,Ca,Ba)(Al,Ga)$_2$S$_4$:Eu$^{2+}$Ba$_2$(Mg,Zn)Si$_2$O$_7$:Eu$^{2+}$ Gd$_{0.46}$Sr$_{0.31}$Al$_{1.23}$O$_x$F$_{1.38}$:Eu$^{2+}$$_{0.06}$ (Ba$_{1-x-y}$Sr$_x$Ca$_y$)SiO$_4$:Eu Ba$_2$SiO$_4$:Eu$^{2+}$.

The lighting device can comprise solid-state light sources arranged with one or more phosphors so as to provide at least one of blue-shifted yellow (BSY), blue-shifted green (BSG), blue-shifted red (BSR), green-shifted red (GSR), and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Exemplary GSR LED-phosphor combinations are disclosed in co-assigned U.S. Application No. 61/474,069, filed Apr. 11, 2011, which is incorporated herein by reference. Likewise, a cyan LED with a red emitting phosphor radiationally coupled thereto and absorbing some of the cyan light and emitting red light provides for a device having CSR light.

As an example, a plurality of different phosphor materials can be chosen and/or their composition, concentration, thickness, and/or spatially arrangement predetermined on or within the diffuser such that the phosphor is remotely positioned from the LED elements. In this manner, the diffuser with remotely positioned phosphor can more uniformly and reproducibly convert the LED light into a collection of phosphor-emitted light of different wavelengths determined by the power distribution to the particular LED elements exciting the phosphors. This configuration also allows for the total volume and/or amount of phosphor used in an LED package to be reduced relative to an LED element coated with the phosphor.

Thus, for example, when increased color warmth is desired in an LED package, one or more red-emitting phosphors, for example, Eu$^{+2}$-doped nitrides or sulfides can be used, however, at an increased cost proportional to the total amount used. Other suitable spatially separated phosphor-diffuser configurations may be used depending on the LED and the particular color light, CRI, luminous efficacy, or CCT value desired.

Still other embodiments can comprise different LED chips with plural LEDs emitting at different wavelengths exciting the at least one phosphor. For example, a short wavelength emitter radiationally coupled to one or more phosphor emitters, an ultraviolet emitting LED can be used as the LED. Likewise, in the same lighting device, a blue light emitting LED radiationally coupled to the one or more phosphor emitters that are also radiationally coupled to the ultraviolet LED can be arranged.

The phosphors can be spatially arranged on or in the diffuser which can be configured in the shape of a globe, of which can contain or encompass the optical media 61, including air. The phosphors can be arranged in a single layer or in a plurality of layers or volumes of varying thickness and/or composition and/or concentration. Thickness of the phosphor layers can vary in the entirety of the layer, or in discrete sections of the layer, and/or be gradient along the thickness or length direction of the layer. Thickness of the phosphors and phosphor concentration and composition can be achieved using conventional printing and/or photolithographic techniques and/or in combination with spray coating deposition/masking/developing/etching or polishing techniques known in the art. Directly coating the phosphor material to a predetermined thickness will provide a concentration commensurate with the thickness coated. One or more films with the phosphor material in or on the diffuser can be used to provide a predetermined thickness, concentration, and/or composition. The one or more films can have different thicknesses depending at least partially on the predetermined concentration of phosphor material and the desired amount of light to be converted by the plurality of layers. A predetermined concentration of phosphor material in the layer, or a total amount in the layers, includes a range of about 30 percent by weight to less than about 65 percent by weight. Such amounts are less than that required for a similar lighting device with the phosphor coated directly on the solid-state light sources and therefore provides a cost savings for the manufacture of the presently disclosed devices. The use of reduced amount of phosphor in the presently disclosed devices is provided without significant loss in spatially correlated color temperature (CCT) variance or angular color homogeneity of the lighting device. In one embodiment, the phosphor material concentration is less than 65 percent by weight.

A plurality of layers according to one aspect of the present disclosure can be applied with a total concentration level (phosphor loading) of about 30 percent by weight to less than 60 percent by weight per device. In one embodiment, the phosphor material has different predetermined regions (spatial arrangements) with different, predetermined compositions of phosphor material and/or different predetermined concentrations of phosphor material.

Figure 8:
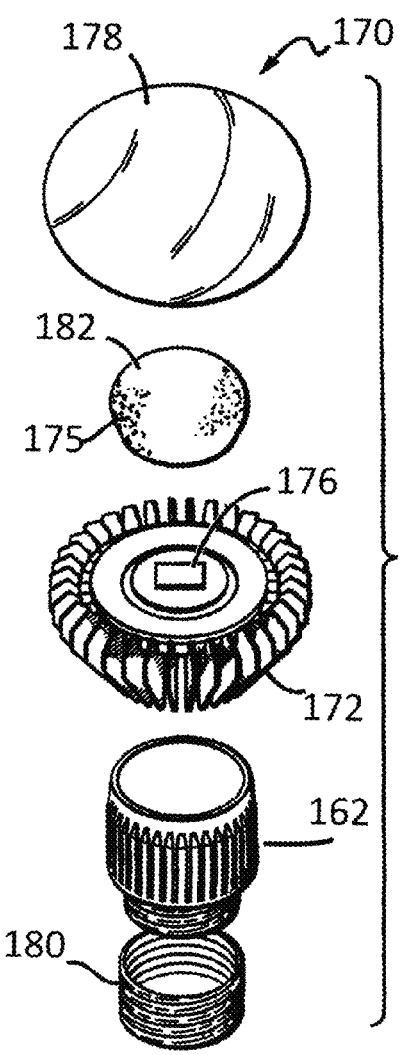
FIG. 8 is an exploded view of the embodiment of FIG. 6.
Figure 7:
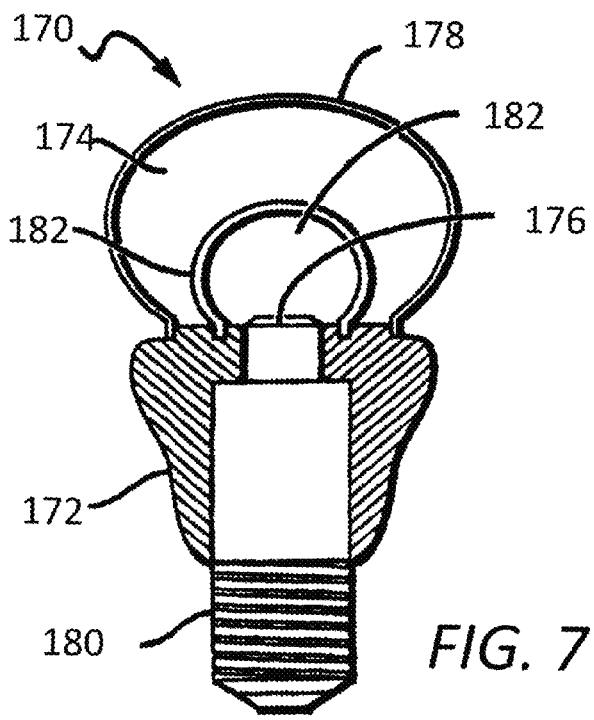
FIG. 7 is a sectional view representing the embodiment of FIG. 6.

FIGS. 6 through 8 show an embodiment of a lamp 170 according to the present disclosure having a heat sink structure 172, optical cavity 174, light source 176, body portion 162 and a screw-threaded portion 180. These features can be made of materials and methods as are known in the art Inner diffuser 182 comprising phosphor of predetermined composition, concentration, thickness, or spatial arrangement within or on diffuser 182. Depending on the embodiment, the diffuser 182 comprises a phosphor or phosphor layer(s) 175 on an inside surface, outside surface, and/or embedded within. In this embodiment, the diffuser 182 is on (e.g., mounted to the heat sink structure 172 and thermally coupled or connected to the heat sink structure 172. In other embodiments, an electrically insulating element (not shown) can be between the heat sink structure and the diffuser 182, and diffuser 182 can be retained by the electrically insulating element. The electrically insulating element can include opening(s) over the light source 176 (e.g., LEDs) to allow the light to pass through while covering the heat sink structure 172 to protect against electrical shock. In some embodiments, the electrically insulating element can also act as a reflector. In this embodiment, diffuser 182 is positioned between light source 176 and an outer dome 178. Diffuser 182 is configured in a substantially hemispherical shape, so as to provide a globe or sphere shape and the solid-state light emitters are arranged so that light from the light source is radiationally coupled to phosphors in or on the diffuser 182 where at least some of the light from the light source is converted. Outer dome 178 encompasses diffuser 182. Outer dome 178 can also function as a second diffuser. Outer dome 178 can be of clear, transparent, or translucent material. Phosphor coatings on the outer surface of diffuser 182 (facing outer dome 178), as depicted in FIG. 4 can be employed, as well as phosphor coatings on inner surface of outer dome 178 (facing diffuser 182) can be employed.

Diffuser 182 comprising the phosphor provides a spatial separation between it and the light source 176. In one aspect, the light source 176 is not mounted in a recess in the heat sink that forms the optical cavity. Instead, in this embodiment, the light source 176 is mounted on the top surface of the heat sink structure 172, with the optical cavity 174 formed by the space between diffuser 182 and the top of the heat sink structure 172. This arrangement can allow for a less Lambertian emission from the optical cavity 174 because there are no optical cavity side surfaces to block and redirect sideways emission.

Figure 9:
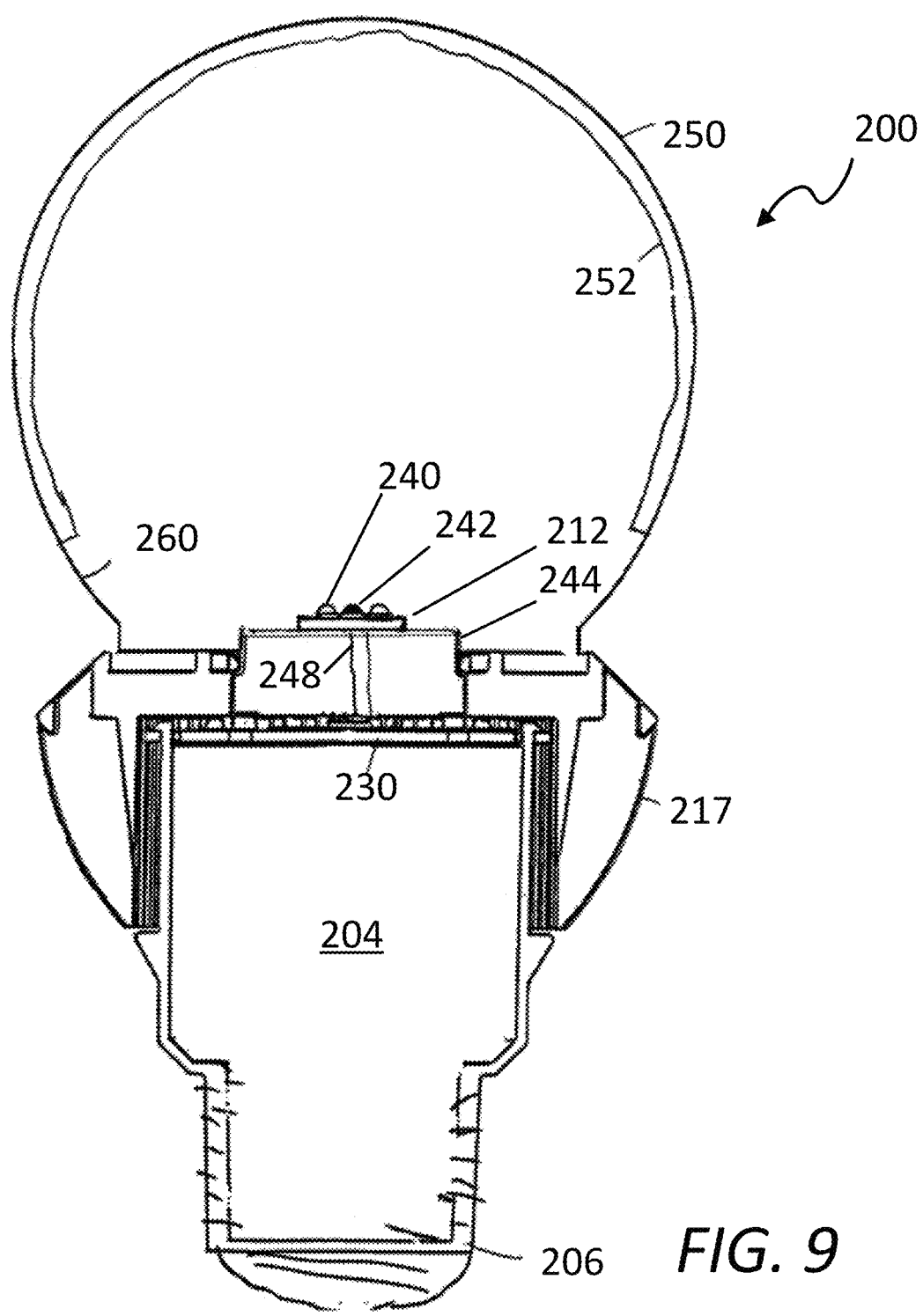
FIG. 9 is a section view of an alternative lamp according to an embodiment of the present disclosure.

In another embodiment, FIG. 9 shows a side view of lamp 200, according to another embodiment of the present disclosure. Lamp 200 can be omnidirectional. FIG. 9 is shown in as a partial cross section. In the case of FIG. 9, an LED assembly having modules 240 and 242, has been interconnected with power supply portion 204 of the lamp. The power supply portion 204 of the lamp includes a power supply consisting of circuitry to provide direct current to the LED assembly. By way of example, the particular power supply portion of an LED lamp shown in FIG. 9 includes an Edison base, 206. The Edison base can engage with an Edison socket so that this example LED lamp 200 can replace a standard incandescent bulb. The electrical terminals of the Edison base are connected to the power supply to provide AC power to the power supply. LED assembly can include multiple LED modules mounted on a carrier such as circuit board 212 or other substrate/submount, which provides both mechanical support and electrical connections for the LEDs. Heat sink 217 and thermal isolation device 230 are provided. The heat sink design can vary, for example, the heat sink may have more extended curved fins, more or fewer fins, etc. A heat sink may be provided that has a more decorative appearance.

Still referring to FIG. 9, LED assembly can comprise, for example, nine LED packages or LED modules, in which an LED chip is encapsulated inside a package with a lens and leads. Lens can have diffusing properties and can have phosphor in or on the lens. Each LED module is mounted in circuit board 212. The LED modules include LEDs operable to emit light of two different colors. LED assembly can comprise, for example, nine LED packages or LED modules, in which an LED chip is encapsulated inside a package with a lens (and/or diffuser) and leads.

Lamp 200 of FIG. 9 is shown with a single diffuser 250 with phosphor 252 coated on inner surface of diffuser 250.

In this particular embodiment, diffuser 250 in combination with reduced amount of phosphor 252 provides color mixing so that color hot spots do not appear in the light pattern being emitted from the lamp. The exterior surface of diffuser 250 may be frosted, painted, etched, roughened, may have a molded in pattern, or may be treated in many other ways to provide color mixing for the lamp. Diffuser 250 may be made of glass, plastic, or some other material that passes light as disclosed above. Phosphor 252 is depicted on or in the interior surface of diffuser 250, for example, the surface facing the LED assembly, but can be incorporated in the diffuser, or combinations thereof. Additional dome structures can be added to lamp 200, as in FIGS. 6-8. The color mixing treatment imparts a particular transmittance-to-reflectance ratio to the enclosure, since some light is necessarily reflected and light reflected from one portion of the diffuser may eventually pass out of the lamp at some other portion of the enclosure. Diffuser 250 in the illustrated embodiment of FIG. 9 includes a substantially transparent section 260. Transparent section 260 is disposed opposite the reflective surface support 244 and allows some of the light reflected from phosphor 252 to leave the lamp relatively unimpeded. By "substantially transparent" what is meant is that for light impinging on section 260 much more light is transmitted than is reflected. Such a section may be as transparent as can reasonably be achieved with normal manufacturing methods, such that it appears transparent to the eye, or it may appear translucent to the eye, notwithstanding the fact that its transmittance-to-reflectance ratio is different than that for the rest of the enclosure.

The LED assembly can be fastened to the support with adhesive, or any of various fastening mechanisms. Support 244 is installed on the pedestal in this example, disposed between LED assembly 202 and the power supply. Support 244 in this example embodiment is a thin reflective surface, which serves to enhance the light output and light distribution of lamp 200, but can be conical. The surface of the reflective surface can be adjusted by setting the angle through altering the height and size and shape of the LED assembly or the base, and by surface treatment to adjust the reflectivity of the outer surface. Wires 248 pass through a void inside the reflective surface of lamp 200 and interconnect LED modules 240 and 242 with the power supply.

The submount of the lighting device can be formed of many different materials with a preferred material being electrically insulating, such as a dielectric element, with the submount being between the LED array and the component backside. The submount can comprise a ceramic such as alumina, aluminum nitride, silicon carbide, or a polymeric material or composite such as polyimide, polyester, etc. In the preferred embodiment, the dielectric material has a high thermal conductivity such as with aluminum nitride and silicon carbide.

When light from a light source is absorbed by the phosphor material, it is re-emitted in isotropic directions with approximately 50 percent of the light emitting forward and 50 percent emitting backward towards the LED. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70 percent, so a percentage of the light directed from the conversion material back into the LED can be lost. In other aspects of the above embodiments, the submount 64 can also comprise additional highly reflective material, such as reflective ceramic or metal layers or cones like silver, to enhance light extraction from the component.

In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

It is understood that LED components according to the present disclosure can be fabricated using a method that incorporates submount panel or wafer comprising a plurality of submounts. Each of the submounts 64 can be formed with its own array of LEDs and globed optical elements such that multiple LED chips 62 can be formed across the submount panel as discussed below. Multiple LED chips 62 can then be singulated from the submount panel. Each submount 64 may also comprise a more complex combination of elements such as a plurality of "submount" assemblies that are mounted on a planar surface of submount. The submount assemblies can have different functionalities such as providing electrostatic discharge (ESD) protection for the various LED chips.

To evaluate the optical properties of the LED packages fabricated in accordance with the present disclosure, the package can be mounted, for example on a Metal Core Printed Circuit Board (MC PCB), whereas luminous flux and CCT at 350 mA can be determined, for example, using conventional LED testing equipment. Luminous intensity and CCT can be determined from −90 to 90 degrees, at intervals of 1 degree from slightly less than about −90 to about 90 degree, in the LED testing equipment to provide spatial CCT variance or difference between maximum and minimum of spatial CCT, as an indicator of angular color homogeneity.

Phosphor layers alone or comprising binder and/or reflective material can be applied to the diffuser surfaces using different processes including but not limited to spraying, immersion (dipping), spin coating, sputtering, printing, powder coating, electrophoretic deposition (EPD), electrostatic deposition, among others. It is understood that a binder is not required. In still other embodiments, the phosphor layer can be separately fabricated and then mounted to or applied on the diffuser.

In one example, a phosphor-binder mixture can be sprayed or dispersed on one or more surfaces of a diffuser with the binder then being cured to form a phosphor layer. It is understood that a phosphor-reflective material-binder mixture can be sprayed or dispersed on one or more surfaces of a transparent globe, with the binder then being cured to provide a diffuser with a phosphor layer. The phosphor-binder mixture can be sprayed, poured or dispersed onto or over a heated diffuser (which may be rotating about an axis substantially perpendicular to the pouring or spraying) so that when the phosphor binder mixture contacts the diffuser, heat from the diffuser spreads into and cures the binder. These processes can also include a solvent in the phosphor-binder mixture that can liquefy and lower the viscosity of the mixture making it more compatible with spraying or pouring. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated diffuser the heat from the diffuser evaporates the solvent, with the temperature of the diffuser controlling, in part, how quickly the solvent is evaporated. A suitable range of temperature for the diffuser can be arranged between about 90 to about 150° C., but it is understood that other temperatures can also be used.

The phosphor alone or comprising binder and/or reflective material can be deposited on the three-dimensional shape of the diffuser, which may require additional steps or other processes to provide the necessary coverage. For example, a solvent-phosphor-binder mixture is provided suitable for spraying, and the diffuser heated as described above, multiple spray nozzles may be used to provide the desired coverage to the diffuser, such as approximate uniform coverage, or a non-uniform coverage (e.g., banding). In other embodiments, fewer spray nozzles can be used while spinning the diffuser to provide the desired coverage.

In still other embodiments, the phosphor layer can be formed through an emersion process whereby the phosphor layer can be formed on the inside or outside surface of the diffuser. The diffuser can be at least partially filled with, or otherwise brought into contact with, a phosphor mixture that adheres to the surface of the diffuser. The mixture can then be drained from the diffuser leaving behind a layer of the phosphor mixture on the surface, which can then be cured. In one embodiment, the mixture can comprise polyethylene oxide (PEO) and a phosphor and reflective material. The diffuser can be filled (or dipped) and then drained or removed, leaving behind a layer of the PEO-phosphor-reflective material mixture, which can then be heat cured. In some embodiments, a binder can be applied to further fix the phosphor layer, while in other embodiments the phosphor can be used without a binder. These processes can be utilized for coating three-dimensional diffusers so as to apply multiple phosphor layers that can have the same or different phosphor materials. One or more phosphor layers can also be applied both on the inside and outside of the diffuser, and/or can have different phosphors having different thickness in different regions of the diffuser. In still other embodiments, different processes can be used such as coating the diffuser with a sheet of phosphor or phosphor-reflective material that can be thermally formed to a diffuser or on a transparent globe.

As mentioned above, one or more bands or areas of phosphor or phosphor-reflective material can be configured on the diffuser. A non-uniform coating of phosphor or phosphor-reflective material that can include multiple partial coats can be used. The partial coats can be prepared, for example, by depositing one coat near the middle of the diffuser, such as in a viewing angle range of approximately 45 to 105° and a second coat can then be deposited at the top of the diffuser dome to cover viewing angles of 0 to approximately 45°. These combined coatings can be configured to block or attenuate most of the light photons between an angle between about 0 and about 105°, allowing more light to pass through the diffuser dome at higher angles. Such non-uniform configurations of coatings can provide emission intensity profiles for a lamp that achieves ENERGY STAR® compliance. Different diffuser band arrangements can be utilized to produce a predetermined desired lamp emission characteristic.

FIGS. 11A through 11F show different embodiments of diffuser domes having different diffuser layers arranged in different ways according to the present disclosure. These are only provided as examples and it is understood that many different arrangements can be provided.

Figure 11A:
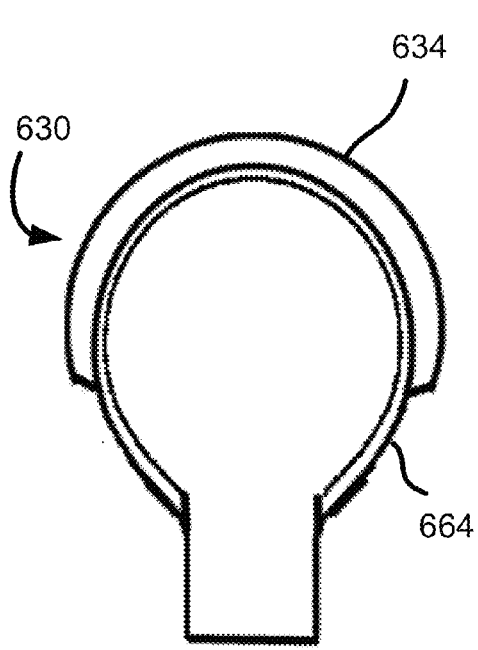
FIGS. 11A, 11B, 11C, 11D, 11E, and 11F schematically depict various sectional views of a diffuser coating configuration as disclosed and described herein.
Figure 11B:
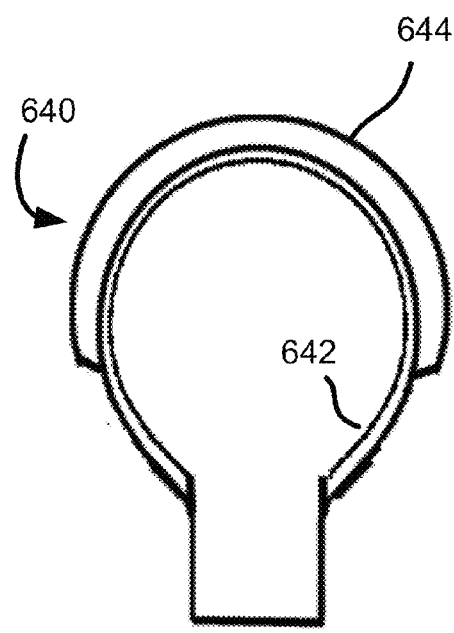
Figure 11C:
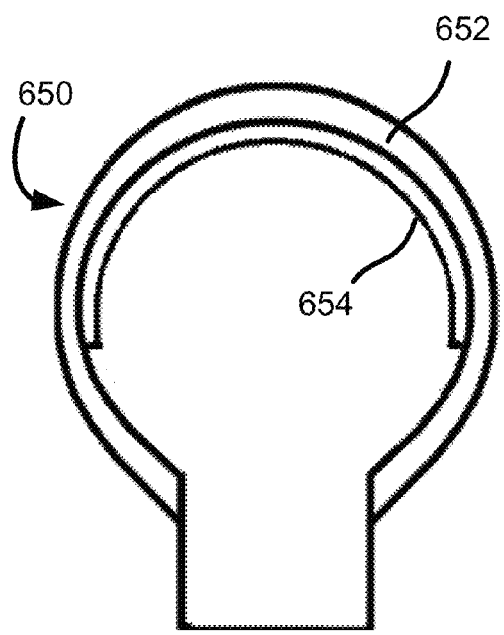
Figures 11D, 11E:
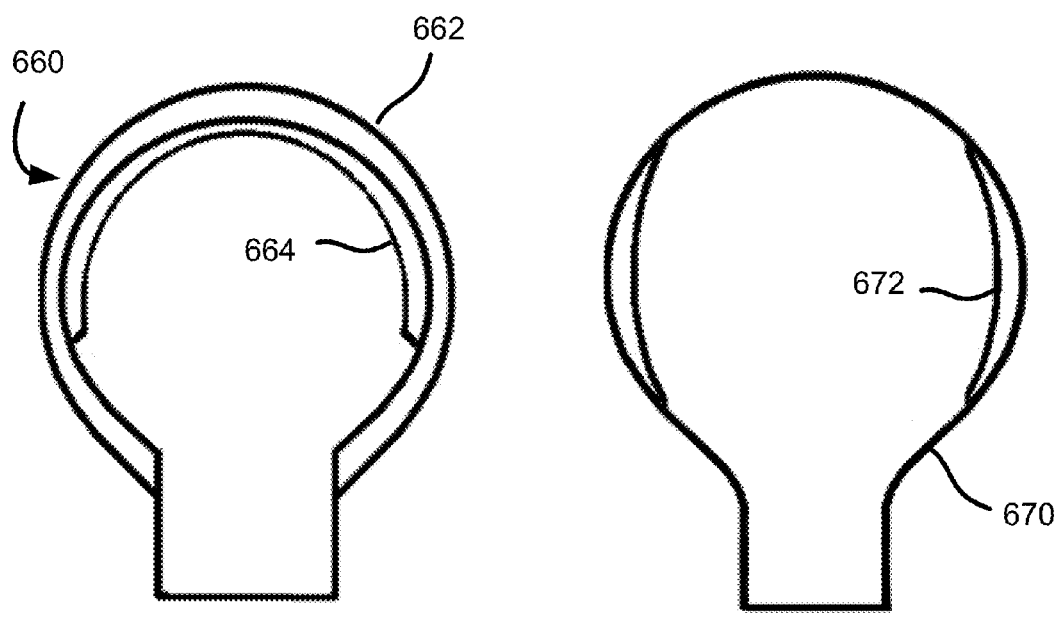
Figure 11F:
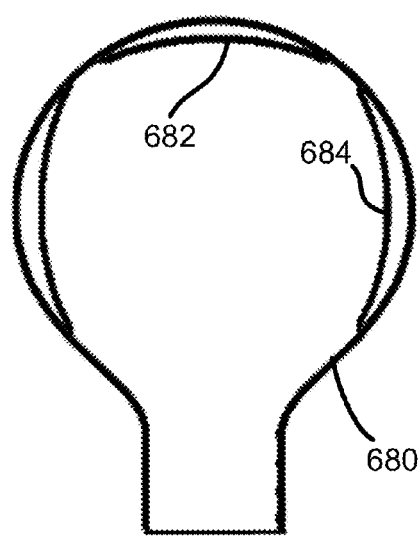

FIG. 11A shows a diffuser dome 630 having a uniform external diffuser coating 632 comprised of phosphor and optional binder, and an external partial coating 634 (which can be a coating of the same composition or a different composition of phosphor and/or reflective material) on the uniform coating 632. It is understood that coating 634 can comprise phosphor and/or reflective material and/or binder even thought diffuser dome 630 can function to diffuse the light. The partial coating 634 can be applied using any of the different methods discussed above, such as by spraying or dip-coating. FIG. 11B shows a diffuser dome 640 with a uniform internal coating 642 and a partial external coating 644 that can be applied using any of the different methods discussed above, such as spraying or dip-coating. FIG. 11C shows a diffuser dome 650 having a uniform external coating 652, and a partial internal coating 654. FIG. 11D shows a diffuser dome 660 with a uniform external coating 662 and a partial internal coating 664 with varying thicknesses. FIG. 11E shows a clear or transparent dome 670 having a partial internal coating 672 of phosphor and reflective material having varying thicknesses such that transparent dome 670 diffuses light. FIG. 11F also shows a clear or transparent dome 680 having multiple internal coatings 682,684 of phosphor and reflective material. All or some of the coatings depicted in FIGS. 11A-11F can have varying thicknesses and/or varying compositions of phosphor and/or reflective material and/or binder.

Although some of the discussion above is directed to varying the characteristics of the coating in areas of the diffuser dome, it is understood that the remote phosphor can have areas of differing concentrations, different relative volume, and different composition of one or more phosphors. These configurations and characteristics can assist in producing the desired emission profile as well as the desired light characteristics of the luminare. For example, the luminare can have increased amount (thickness/concentration/volume) of one or more phosphor at or around the top of the dome, although the increase can be in other areas.

Examples

A lamp similar to lamp 200 comprising plural UV emitting LEDs and spatially separated Ce doped YAG phosphor (e.g., NYAG-04, Intematix, Fremont, Calif.) at 65 weight percent loading (remainder binder) was used as a control and to normalize efficiency to 100 percent. Additional samples were prepared by spray coating with different loadings of reflective material with reduced loadings of phosphor. The results of the normalized efficiency verses control and color uniformity (dv'u') as a function of reflective material composition, size, and loading are summarized in Table 1.

TABLE 1

Loading of reflective material in weight percent with phosphor (remainder binder). Color delta (du'v') was derived from half distance between the 2 most extreme color points (1 azimuth).

| Sample | Size | Material | Loading of reflective material in phosphor (weight percent) | Normalized Efficiency (percent) | Color Delta (du'v') |
|--------|------|----------|------------------------------------------------------------|--------------------------------|---------------------|
| 1 | — | | 0 percent in 65 percent | 100 | 0.013 |
| 2 | 0.5 um | $TiO_2$ | 5 percent in 60 percent | 95.3 | 0.007 |
| 3 | 0.5 um | $TiO_2$ | 7.5 percent in 57.5 percent | 92.3 | 0.0056 |
| 4 | 0.5 um | $TiO_2$ | 5 percent in 30 percent | 94.0 | 0.002 |
| 5 | 5 um | $Al_2O_3$ | 7.5 percent in 57.5 percent | 99.9 | 0.018 |

TABLE 1-continued

Loading of reflective material in weight percent with phosphor (remainder binder). Color delta (du'v') was derived from half distance between the 2 most extreme color points (1 azimuth).

| Sample | Size | Material | Loading of reflective material in phosphor (weight percent) | Normalized Efficiency (percent) | Color Delta (du'v') |
|---|---|---|---|---|---|
| 6 | 5 um | $Al_2O_3$ | 5 percent in 30 percent | 95.8 | 0.016 |
| 7 | 0.5 um | $Al_2O_3$ | 5 percent in 30 percent | 98.7 | 0.01 |
| 8 | 0.5 um | $Al_2O_3$ | 7 percent in 30 percent | 98.2 | 0.007 |
| 9 | 0.5 um | $Al_2O_3$ | 10 percent in 30 percent | 99.6 | 0.006 |
| 10 | 0.5 um | $Al_2O_3$ | 15 percent in 30 percent | 98.7 | 0.003 |

The data of Table 1 demonstrates that reflective material added to the diffuser in combination with spatially separated phosphor can provide excellent color uniformity with high efficiency at lower total loadings of phosphor. Thus, as the reflective material is a lower cost than that of the phosphor, it is possible to reduce the amount of phosphor used and hence reduce the total cost of the device. Moreover, the high refractive index and small particle size of the reflective material remotely positioned from the light source provides backward scattering with minimization of delta color uniformity (du'v') resulting from lack of blue light at high angle. The data of Table 1 also demonstrates that $Al_2O_3$ loading can be increased with minimization of delta color uniformity (du'v') and without loss of efficiency.

Figure 10:
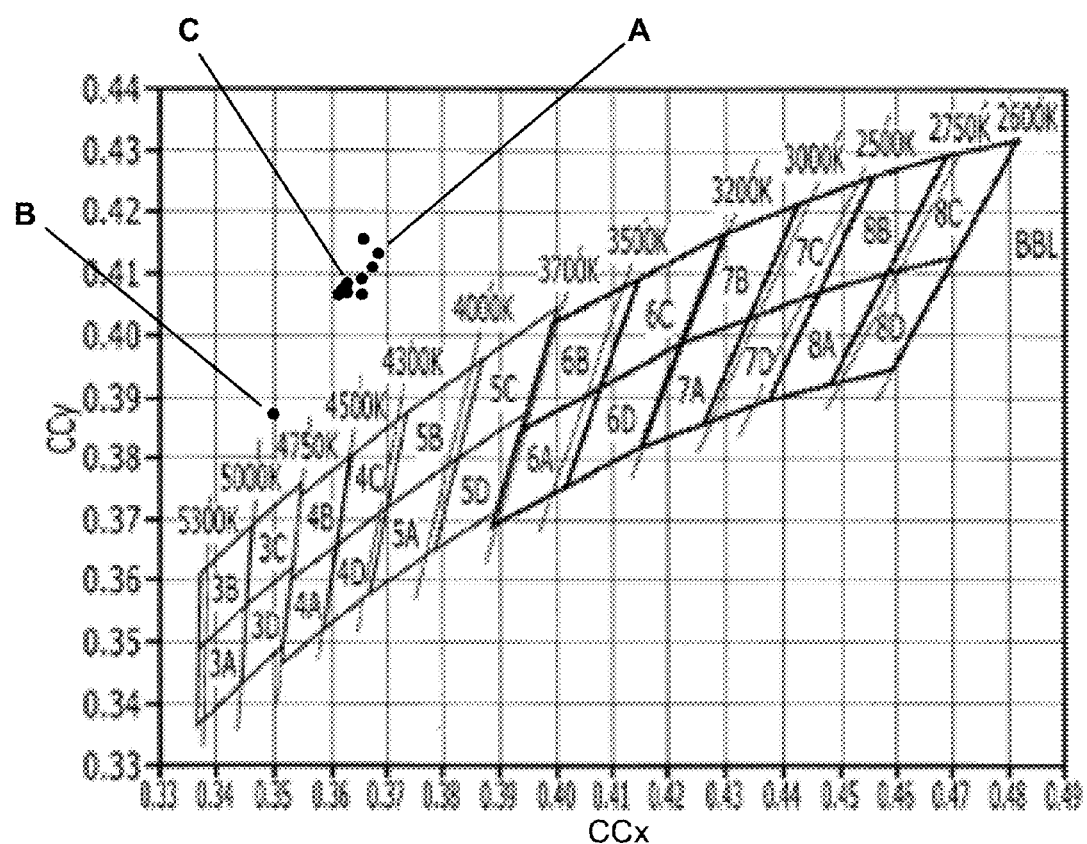
FIG. 10 depicts color uniformity properties of lamps according to embodiments of the present disclosure, on a chromaticity diagram.

With reference to FIG. 10, the testing data from the lamps summarized in Table 1 were presented on a chromaticity diagram. Representative data points A, B, and C correspond to Examples 1, 10, and 4, respectively. Data point B represents a high efficiency, low phosphor loading (30 percent) having minimal du'v' comprising 0.5 micron average size titanium dioxide at 5 percent by weight phosphor. Data point C represents a 98.7 percent normalized efficiency, low phosphor loading (30 percent) having minimal du'v' comprising 0.5 micron average size alumina at 15 percent by weight phosphor. The remaining data points of Table 1 appear on FIG. 10 in proximity to data points A and C.

It is understood that the LED chips in the arrays including the globe optical element as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference. In other embodiments, single LED element luminary packages can also be provided. The LED device can be configured as a flip chip LED package.

The lighting sources and devices presently disclosed are generally applicable to a variety of existing lighting packages, for example, XLamp products XM-L, ML-B, ML-E, MP-L EasyWhite, MX-3, MX-6, XP-G, XP-E, XP-C, MC-E, XR-E, XR-C, and XR LED packages manufactured by Cree, Inc. The benefits of the present disclosure can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

What is claimed:

1. A light device comprising:
a LED light source;
a diffuser configured for color mixing of the light from the LED light source and spatially separated therefrom; the diffuser comprising:
a phosphor material having a binder and at least one phosphor present in an amount of 30 weight percent to 57.5 weight percent; and a reflective material wherein the reflective material is present in an amount of about 5 weight percent of the phosphor present in the phosphor material to about 60 weight percent of the phosphor present in the phosphor material.

2. The lighting device of claim 1, wherein both the phosphor and reflective material are present within the diffuser.

3. The lighting device of claim 1, wherein the phosphor and reflective material are deposited on the diffuser.

4. The lighting device of claim 1, wherein the phosphor is deposited on the reflective material.

5. The lighting device of claim 1, wherein diffuser at least partially surrounds the at least one solid-state light source.

6. The lighting device of claim 1, wherein the diffuser is transparent or translucent.

7. The lighting device of claim 1, wherein the diffuser is a glass or ceramic.

8. The lighting device of claim 1, wherein the diffuser is a polymer.

9. The lighting device of claim 1, wherein the polymer comprises at least one of polysilicone, polyacrylate, polyarylate, polycarbonate, and blends thereof.

10. The lighting device of claim 1, wherein the reflective material is at least one of titanium dioxide, zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof.

11. The lighting device of claim 1, wherein the reflective material is titanium dioxide.

12. The lighting device of claim 1, wherein the reflective material is alumina.

13. The lighting device of claim 1, the diffuser having an outer surface and an inner surface, the inner surface in closer proximity to the LED light source; wherein the reflective material is on outer surface and the phosphor is on the inner surface.

14. The lighting device of claim 1, the diffuser having an outer surface and an inner surface, the inner surface in closer proximity to the LED light source; wherein the phosphor is on outer surface and the reflective material is on the inner surface.

15. The lighting device of claim 1, further comprising a globe at least partially surrounding the diffuser.

16. The lighting device of claim 1, wherein the phosphor is between 5 and 50 μm thick.

17. The lighting device of claim 1, wherein the phosphor is between 1 and 25 μm thick.

18. The lighting device of claim 1, wherein the outside surface of the diffuser is etched or sand blasted.

19. The lighting device of claim 1, wherein the solid-state light source comprises at least one LED with a GaN emitting layer.

20. The lighting device of claim 1, wherein the LED light source and the phosphor are configured for providing at least one of blue-shifted yellow (BSY), blue-shifted green (BSG), blue-shifted red (BSR), green-shifted red (GSR), and cyan-shifted red (CSR) light.

21. The lighting device of claim 1, wherein the solid-state light source comprises at least a second LED that emits one of UV, blue, royal blue and cyan light.

22. The lighting device of claim 1, wherein the solid-state light source comprises at least one of UV, blue, green, orange, and red LED devices.

23. The lighting device of claim 1, wherein the phosphor includes at least one of red, red/orange, yellow, green and cyan emitting phosphor.

24. The lighting device of claim 1, wherein the phosphor includes at least two different color emitting phosphors.

25. A method of fabricating a lighting device having a reduced total amount of phosphor, the method comprising the step of
providing a diffuser structure comprising:
an amount of phosphor present in a binder;
an amount of reflective material relative to the amount of phosphor;
the diffuser structure configured for color mixing of the light from a LED light source and for spatially separating the amount of phosphor from the LED light source,
wherein the phosphor is present at about 30 weight percent to 57.5 weight percent in the binder and the reflective material is present in an amount of about 5 weight percent to about 60 weight percent of the amount of phosphor present in the binder.

26. The method of claim 25, wherein the phosphor is present within the diffuser.

27. The method of claim 25, wherein the phosphor is deposited on the diffuser.

28. The method of claim 25, wherein the diffuser structure comprises polysilicone, polyacrylate, polyarylate, polycarbonate, cyclic olefinic copolymer, glass, ceramic, or precursor material thereof.

29. The method of claim 25, wherein the diffuser structure at least partially surrounds the LED light source.

30. The method of claim 25, wherein the amount of phosphor reduced is red phosphor.

31. The method of claim 25, wherein the reflective material is at least one of titanium dioxide, zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof.

32. The method of claim 25, wherein the diffuser comprises an outer surface and an inner surface with the reflective material deposited on the outer surface of the diffuser.

33. The method of claim 25, wherein the lighting device further comprising one or more filters to reduce or eliminate IR- and UV-light release from the lighting device.

* * * * *